(12) United States Patent
Min et al.

(10) Patent No.: US 11,272,613 B2
(45) Date of Patent: Mar. 8, 2022

(54) PRINTED CIRCUIT BOARD AND PACKAGE INCLUDING PRINTED CIRCUIT BOARD

(71) Applicant: Samsung Electro-Mechanics Co., Ltd., Suwon-si (KR)

(72) Inventors: Tae-Hong Min, Suwon-si (KR); Ju-Ho Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/674,460

(22) Filed: Nov. 5, 2019

(65) Prior Publication Data

US 2020/0178389 A1    Jun. 4, 2020

(30) Foreign Application Priority Data

Dec. 4, 2018    (KR) .......................... 10-2018-0154667

(51) Int. Cl.
| | |
|---|---|
| H05K 1/03 | (2006.01) |
| H05K 1/02 | (2006.01) |
| H01Q 1/22 | (2006.01) |
| H05K 1/14 | (2006.01) |
| H05K 1/11 | (2006.01) |
| H05K 1/18 | (2006.01) |

(52) U.S. Cl.
CPC ......... *H05K 1/0393* (2013.01); *H01Q 1/2283* (2013.01); *H05K 1/0237* (2013.01); *H05K 1/115* (2013.01); *H05K 1/144* (2013.01); *H05K 1/189* (2013.01)

(58) Field of Classification Search
CPC ...... H05K 1/0393; H05K 1/115; H05K 1/144; H05K 1/189; H05K 1/0237; H01Q 1/0283

USPC .......................................................... 174/258
See application file for complete search history.

(56) References Cited

U.S. PATENT DOCUMENTS

| | | |
|---|---|---|
| 2011/0169698 A1 | 7/2011 | Niemi |
| 2013/0075140 A1 | 3/2013 | Amano et al. |
| 2014/0145883 A1* | 5/2014 | Baks ................. H01Q 1/2283 343/700 MS |
| 2016/0020165 A1 | 1/2016 | Kamgaing et al. |
| 2018/0331027 A1* | 11/2018 | Chen ................... H01L 24/20 |
| 2020/0066662 A1* | 2/2020 | Lee ..................... H01L 23/552 |

FOREIGN PATENT DOCUMENTS

| | | |
|---|---|---|
| KR | 10-2013-0034643 A | 4/2013 |
| KR | 10-2016-0130290 A | 11/2016 |

OTHER PUBLICATIONS

Korean Office Action dated Apr. 20, 2021 issued in counterpart Korean Patent Application No. 10-2018-0154667 (8 pages in English)(5 pages in Korean).

* cited by examiner

*Primary Examiner* — Tremesha S Willis
(74) *Attorney, Agent, or Firm* — NSIP Law

(57) ABSTRACT

A printed circuit board includes: a laminate including a core layer and insulating layers stacked on first and second sides of the core layer; and a first antenna formed on a surface of the laminate. A thickness of the core layer is greater than a thickness of one of the insulating layers. A dielectric constant of the core layer is higher than a dielectric constant of the one of the insulating layers.

39 Claims, 8 Drawing Sheets

PRINTED CIRCUIT BOARD AND PACKAGE INCLUDING PRINTED CIRCUIT BOARD

CROSS-REFERENCE TO RELATED APPLICATIONS

This application claims the benefit under 35 U.S.C. § 119(a) of Korean Patent Application No. 10-2018-0154667 filed on Dec. 4, 2018 in the Korean Intellectual Property Office, the entire disclosure of which is incorporated herein by reference for all purposes.

BACKGROUND

1. Field

The following description relates to a printed circuit board and a package including a printed circuit board.

2. Description of Related Art

Countries around the world are concentrating on technology development for 5G commercialization. It may be difficult to smoothly transmit signals in a frequency band of 10 GHz or more in the 5G era with existing materials and structures. Accordingly, a new material and structure for transmitting received high-frequency signals to a main board without loss are being developed.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, a printed circuit board includes: a laminate including a core layer and insulating layers stacked on first and second sides of the core layer; and a first antenna formed on a surface of the laminate. A thickness of the core layer is greater than a thickness of one of the insulating layers. A dielectric constant of the core layer is higher than a dielectric constant of the one of the insulating layers.

A dielectric dissipation factor of the core layer may be lower than a dielectric dissipation factor of the one of the insulating layers.

A rigidity of the core layer may be less than or equal to a rigidity of the one of the insulating layers.

The printed circuit board may further include a second antenna formed on a surface of the core layer.

The printed circuit board may further include an additional antenna formed in the laminate such that the first antenna and the additional antenna are located on opposite sides with respect to the core layer.

The printed circuit board may further include a flexible insulating layer having a region in vertical contact with the one of insulating layers, and a remaining region disposed outside the laminate.

A connection terminal may be disposed at an end of the flexible insulating layer located outside the laminate.

An additional antenna may be disposed at an end of the flexible insulating layer located outside the laminate.

The flexible insulating layer may include a thermoplastic resin layer and a thermosetting resin layer that are vertically stacked.

A circuit may protrude to the thermosetting resin layer at an interface between the thermoplastic resin layer and the thermosetting resin layer.

The one of the insulating layers may include a thermoplastic resin layer and a thermosetting resin layer that are vertically stacked.

Another one of the insulating layers may include a thermoplastic resin layer and a thermosetting resin layer that are vertically stacked.

The printed circuit board may further include a solder resist layer stacked on first and second sides of the laminate.

In another general aspect, a package includes: a laminate including a core layer and insulating layers vertically stacked on first and second sides of the core layer; a first antenna formed on a surface of the laminate; and an electronic element mounted on another surface of the laminate. A thickness of the core layer may be greater than a thickness of the insulating layers. A dielectric constant of the core layer may be higher than a dielectric constant of the insulating layers.

A dielectric dissipation factor of the core layer may be lower than a dielectric dissipation factor of the insulating layers.

A rigidity of the core layer may be less than or equal to a rigidity of the one of the insulating layers.

The package may further include a second antenna formed on a surface of the core layer.

The package may further include an additional antenna formed in the laminate such that the first antenna and the additional antenna are disposed on opposite sides with respect to the core layer.

The package may further include a flexible insulating layer having a region in vertical contact with the one of the insulating layers, and a remaining region disposed outside the laminate.

A connection terminal may be formed at an end of the flexible insulating layer disposed outside the laminate.

An additional antenna may be formed at an end of the flexible insulating layer located outside the laminate.

The flexible insulating layer may include a thermoplastic resin layer and a thermosetting resin layer that are vertically stacked.

A circuit may protrude to the thermosetting resin layer at an interface between the thermoplastic resin layer and the thermosetting resin layer.

The one of the insulating layers may include a thermoplastic resin layer and a thermosetting resin layer that are vertically stacked.

Another one of the insulating layers may include a thermoplastic resin layer and a thermosetting resin layer that are vertically stacked.

The package may further include a solder resist layer stacked on first and second sides of the laminate.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
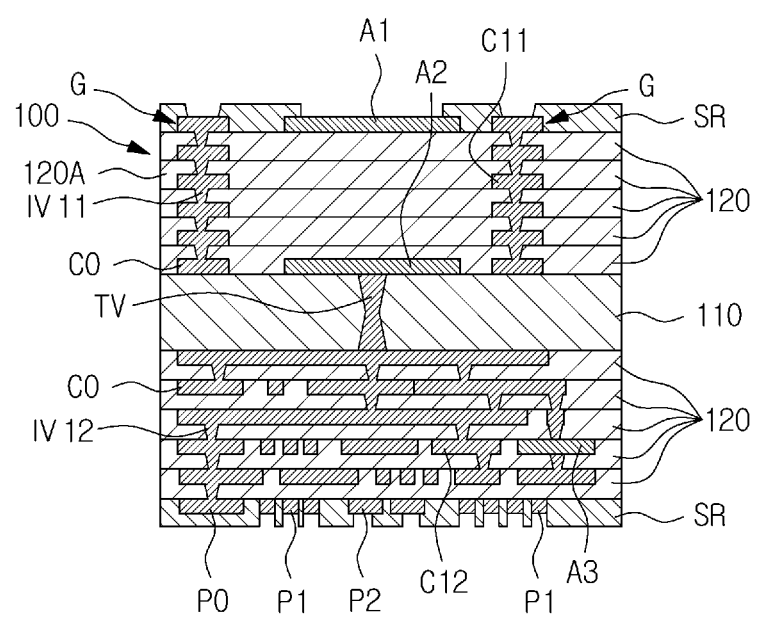
FIG. 1 is a diagram showing a printed circuit board, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
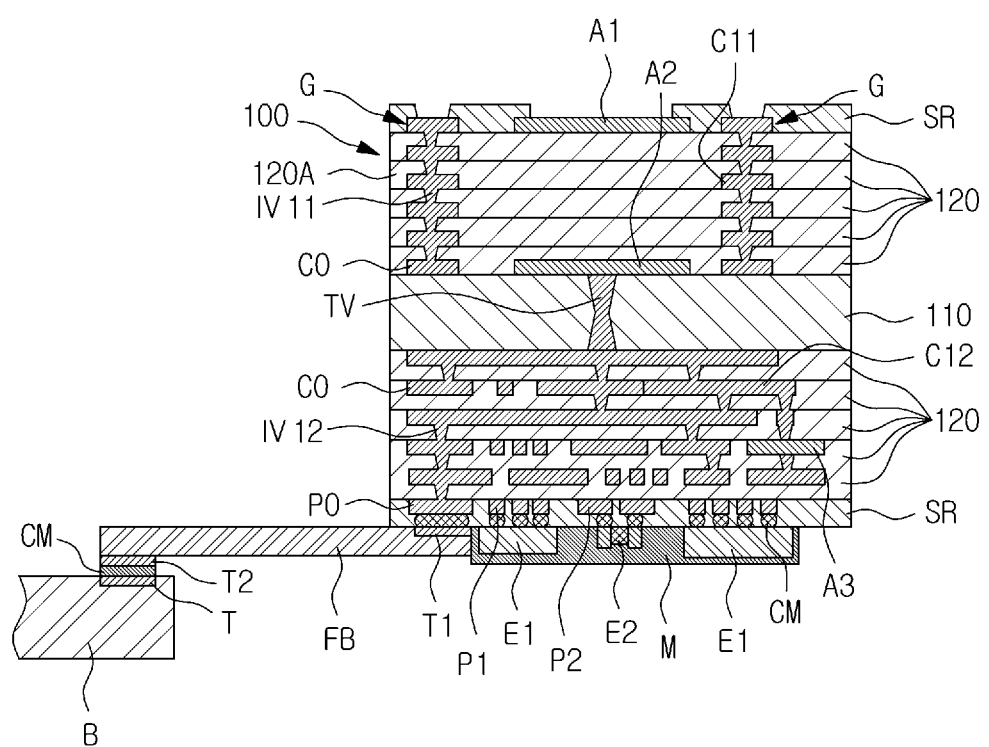
FIG. 2 is a diagram showing a package including the printed circuit board of FIG. 1, according to an embodiment.

FIG. 1 is a diagram showing a printed circuit board (PCB), according to an embodiment. FIG. 2 is a diagram showing a package including the PCB of FIG. 1.

Referring to FIG. 1, the PCB may include a laminate 100 and a first antenna A1.

The laminate 100 includes a core layer 110 and insulating layers 120. For example, the insulating layers 120 may be stacked on both sides (e.g., two opposite sides) of the core layer 110. The insulating layers 120 may include a flexible layer having a relatively high bendability and a non-flexible layer having a relatively low bendability. However, in the embodiment illustrated in FIG. 1, the insulating layers 120 include only a non-flexible layer.

The core layer 110 may be formed of a dielectric and may include either one or both of polytetrafluoroethylene (PTFE) and perfluoroalkoxy (PFA). The core layer 110 may have a thickness of 200 µm to 300 µm. The core layer 110 may contain inorganic fillers.

The insulating layers (non-flexible layers) 120 are formed of a resin material having a relatively low bendability and may include an epoxy resin and/or an imidazole resin. The non-flexible layers 120 may include a fiber reinforcing material such as glass fiber and may be a prepreg, which is an epoxy resin containing the fiber reinforcing material. The non-flexible layers 120 may contain inorganic fillers. One of the insulating layers (non-flexible layers) 120 may have a thickness that is less than a thickness of the core layer 110.

The core layer 110 may have a higher dielectric constant or than one of the insulating layers (non-flexible layers) 120. That is, the core layer 110 may have a greater thickness and a higher dielectric constant than a non-flexible layer 120A.

In particular, the dielectric constant of the core layer 110 may be at least twice as high as that of the non-flexible layer 120A.

The core layer 110 may have a dielectric dissipation factor (Df) that is lower than a Df of one of the insulating layers (non-flexible layers) 120. The Df of the core layer 110 may be less than or equal to 0.003. The core layer 110 may have a greater thickness, a higher dielectric constant, and a lower Df than the non-flexible layer 120A.

Also, a rigidity of the core layer 110 may be less than or equal to a rigidity of one of the insulating layers (non-flexible layers) 120. The core layer 110 may have a greater thickness, a higher dielectric constant, and a lower Df than the non-flexible layer 120A, and the rigidity of the core layer 110 may be the same as or lower than that of the non-flexible layer 120A.

A circuit C0 may have portions formed on both sides of the core layer 110, and the portions of the circuit C0 formed on both sides of the core layer 110 may be electrically connected to each other by a through-via TV passing through the core layer 110.

Circuits C11 and C12 may be formed on first surfaces of the non-flexible layers 120. At least a portion of the circuit C11 formed at one side of the core layer 110 may be used as a ground G, and the portion of the circuit C11 used as the ground G may be connected to the portion of the circuit C0 formed on one surface of the core layer 110. The circuit C12 formed at the other side of the core layer 110 may be electrically connected to the portion of the circuit C0 formed on the other surface of the core layer 110, and at least a portion of the circuit C12 formed at the other side of the core layer 110 may be used as a feeding line. Also, the portion of the circuit C12 formed at the other side of the core layer 110 may be connected to mounting pads P1 and P2 for mounting an electronic element.

The portion of the circuit C11 used as the ground G may be connected to an inner via IV11, and the circuit C11 may have portions connected by inner vias IV11. The inner vias IV11 may be vertically stacked. The portion of the circuit C12 formed at the other side of the core layer 110 may be connected to an inner via IV12.

The first antenna A1 may be formed on one surface of the laminate 100 to receive or transmit signals. The first antenna A1 may be formed on one surface of the outermost layer among the non-flexible layers 120. The first antenna A1 may include a patch antenna or may include a plurality of patch antennas to form an antenna array. The patch antenna may have a quadrangular shape, but the disclosure is not limited to this example. The first antenna A1 may include a dipole antenna, a monopole antenna, and the like, as well as the patch antenna.

The PCB may further include a second antenna A2, an additional antenna A3, and a solder resist layer SR.

The second antenna A2 is formed in the laminate 100 to vertically correspond to the first antenna A1. Herein, the phrase "vertically correspond to" means that a virtual line extending from any point of the first antenna A1 in the thickness direction of the laminate 100 intersects the second antenna A2. That is, the first antenna A1 and the second antenna A2 may at least partially overlap each other in the vertical direction. The second antenna A2 and the first antenna A1 may be the same type. For example, the first antenna A1 and the second antenna A2 may both be patch antennas, and may form an antenna array. In this case, the entire antenna array of the first antenna A1 may vertically correspond to the entire antenna array of the second antenna A2.

The second antenna A2 may be formed on one surface of the core layer 110 (a surface facing the first antenna A1, i.e., an upper surface in FIG. 1). Also, the second antenna A2 may be electrically connected to the through-via TV passing through the core layer 110.

At least some of insulating layers (non-flexible layers) 120 may be disposed between the first antenna A1 and the second antenna A2. That is, the non-flexible layers 120 may be stacked on an upper side of the core layer 110, the first antenna A1 may be formed on one surface of the outermost layer among the non-flexible layers 120, and the second antenna A2 may be formed on one surface of the core layer 110. The first antenna A1 and the second antenna A2 may be directly connected to each other through a via. However, even when the first antenna A1 and the second antenna A2 are not directly connected to each other, the non-flexible layer 120 disposed between the first antenna A1 and the second antenna A2 is a dielectric and an electrical interaction may occur between the first antenna A1 and the second antenna A2.

Third to Nth (N being a natural number greater than 3) antennas may be disposed between the first antenna A1 and the second antenna A2. For example, antennas (the third to Nth antennas) corresponding to the first antenna A1 and the second antenna A2 may be disposed on one surface of each of the non-flexible layers 120 disposed between the first antenna A1 and the second antenna A2. Also, the second to Nth antennas are removable, and the first antenna A1 may function alone.

The additional antenna A3 may be formed inside the laminate 100 to transmit or receive signals different from signals of the first antenna A1. The additional antenna A3 may be located at the other side of the core layer 110 (a side not facing the first antenna A1, i.e., a lower side in FIG. 1). As a result, the first antenna A1 and the additional antenna A3 may be located at opposite sides with respect to the core layer 110.

The additional antenna A3 and the first antenna A1 may be different types of antennas. For example, the first antenna A1 may be a patch antenna, and the additional antenna A3 may be a monopole antenna or a dipole antenna. The additional antenna A3 may be used to process various signals in one PCB.

The solder resist layer SR may be stacked on both sides of the laminate 100. The solder resist layer SR may be stacked on one surface of the laminate 100 to expose the first antenna A1 and the portion of the circuit C11 used as the ground G and may be stacked on the other surface of the laminate 100 to expose the mounting pads P1 and P2.

Referring to FIG. 2, the package includes the PCB of FIG. 1 and an electronic element mounted on the PCB. Here, because the PCB is the same as the PCB of FIG. 1, a redundant description thereof will be omitted.

The electronic element may process a signal received from the first antenna A1 or a signal to be transmitted to the first antenna A1, and may include various components such as an active element, a passive element, an integrated circuit (IC), and the like. The electronic element may include various types of elements forming an electronic element module. For example, the electronic element may include an IC E1, such as a radio frequency integrated circuit (RFIC), and a passive element E2, such as a capacitor. A plurality of ICs E1 and a plurality of passive elements E2 may be included.

The electronic element may be mounted on the PCB using a conductive member CM, and the conductive member CM may be a solder member containing a low melting point metal such as tin. For example, a pad is formed on the electronic element, and the mounting pads P1 and P2 are also formed on the PCB. Then, the pad of the electronic element and the mounting pads P1 and P2 of the PCB may be bonded to each other using the conductive member CM.

In the package of FIG. 2, the electronic element may be molded with a molding material M. The molding material may include a resin, and may be an epoxy molding compound (EMC), for example.

When the package is coupled to an external board B (e.g., a main board), the package is coupled to a separate flexible board FB. For example, a terminal pad P0 of the package and a first terminal T1 of the flexible board FB may be bonded to each other with the conductive member CM. The flexible board FB is extended or bent toward the external board B and a second terminal T2 of the flexible board FB is bonded to a terminal T of the external board B with the conductive member CM, and thus the package and the external board B may be electrically connected to each other.

When the first antenna A1 receives a signal, the received signal may be delivered to the electronic element via the circuit of the laminate 100, and the signal processed by the electronic element may be delivered to the external board B via the circuit of the flexible board FB. When the first antenna A1 transmits a signal, the signal may be delivered from the external board B to the electronic element via the circuit of the flexible board FB, and then the signal processed by the electronic element may be delivered to the first antenna A1 through the circuit of the laminate 100.

Figure 3:
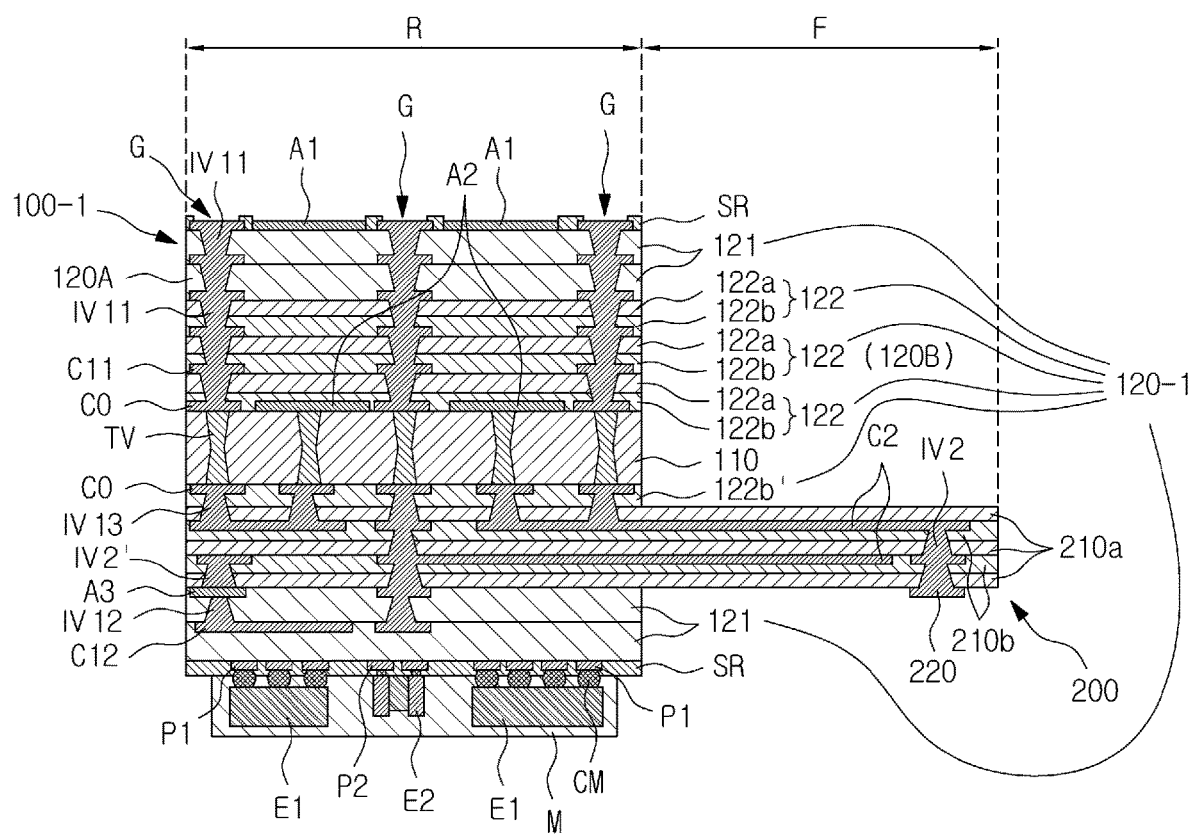
FIGS. 3 and 4 are diagrams showing a printed circuit board and a package including the printed circuit board, according to an embodiment.
Figure 4:
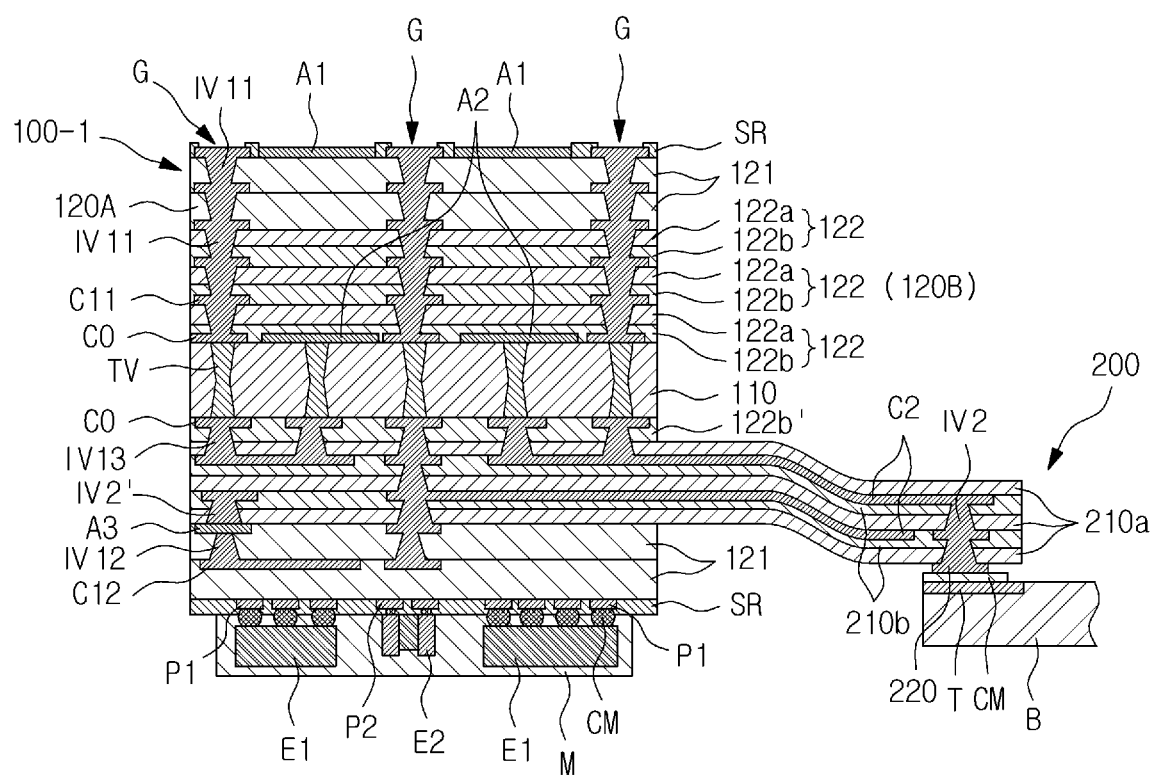

FIGS. 3 and 4 are diagrams showing a PCB and a package including the PCB, according to an embodiment.

Referring to FIG. 3, the PCB may include a laminate 100-1 and a first antenna A1.

The laminate 100-1 includes the core layer 110 and insulating layers 120. In particular, the insulating layers 120-1 may be stacked on both sides of the core layer 110. The insulating layers 120-1 may include a flexible layer 122 having a relatively high bendability and a non-flexible layer 121 having a relatively low bendability.

The core layer 110 may be formed of a dielectric and may include either one or both of PTFE and PFA. The core layer 110 may have a thickness of 200 μm to 300 μm. The core layer 110 may contain inorganic fillers.

Among the insulating layers 120-1, the non-flexible layer 121 is formed of a resin material having a relatively low bendability and may include an epoxy resin and/or an imidazole resin. The non-flexible layer 121 may include a fiber reinforcing material such as glass fiber and may be a prepreg, which is an epoxy resin containing the fiber reinforcing material. The non-flexible layer 121 may contain inorganic fillers. One of the insulating layers 120-1 (the flexible layer 122 or the non-flexible layer 121) may have a thickness that is less than a thickness of the core layer 110.

Among the insulating layers 120-1, the flexible layer 122 may be formed of an insulating material having a high bendability, and may include any one or any combination of any two or more of polyimide (PI), a liquid crystal polymer (LCP), PTFE, Teflon, PFA, PPS, polyphenylene ether (PPE), and polyphenylene oxide (PPO).

The flexible layer 122 may be formed in a layer around the core layer 110 such that the flexible layer 122 is in contact with the core layer 110. The non-flexible layer 121 may be formed outside (in a vertical/thickness direction) the flexible layers 122, but the disclosure is not limited to such a configuration.

The core layer 110 may have a higher dielectric constant than a dielectric constant of the insulating layers 120-1. That is, the core layer 110 may have a greater thickness and a higher dielectric constant than the insulating layer 120A or 120B. For example, the dielectric constant of the core layer 110 may be at least twice as high as that of the insulating layer 120A or 120B.

The core layer 110 may have a lower Df than one of the insulating layers 120-1. The Df of the core layer 110 may be less than or equal to 0.003. The core layer 110 may have a greater thickness, a higher dielectric constant, and a lower Df than the one insulating layer 120A or 120B. For example, the Df of the core layer 110 may be less than or equal to 0.003, and the Df of the insulating layer 120A or 120B may be greater than 0.003.

Also, a rigidity of the core layer 110 may be less than or equal to a rigidity of one of the insulating layers 120-1. That is, the core layer 110 may have a greater thickness, a higher dielectric constant, and a lower Df than the insulating layer 120A or 120B, and the rigidity of the core layer 110 may be the same as or lower than the rigidity of the insulating layer 120A or 120B.

One insulating layer 122 may include a thermosetting resin layer 122b and a thermoplastic resin layer 122a, and the thermosetting resin layer 122b may be an adhesive layer. The thermosetting resin layer 122b may be located closer to the core layer than the thermoplastic resin layer 122a is. In the flexible layer 122 that is in contact with the core layer 110, the thermosetting resin layer 122b and the core layer 110 may be in contact with each other.

The circuit C0 may have portions formed on both sides of the core layer 110, and the portions of the circuit C0 formed on both sides of the core layer 110 may be electrically connected by through-vias TV passing through the core layer 110.

The circuits C11 and C12 may be formed on one surfaces of the insulating layers 120-1. At least a portion of the circuit C11 formed at one side of the core layer 110 may be used as a ground G, and the portion of the circuit C11 used as the ground G may be connected to the portion of the circuit C0 formed on one surface of the core layer 110. At least a portion of the circuit C12 formed at the other side of the core layer 110 may be used as a feeding line. Also, the portion of the circuit C12 formed at the other side of the core layer 110 may be connected to the mounting pads P1 and P2 for mounting an electronic element.

The portion of the circuit C11 used as the ground G may be connected to an inner via IV11 among the inner vias IV11, and the circuit C11 may have portions connected by the inner vias IV11. The inner vias IV11 may be vertically stacked. The portion of the circuit C12 formed at the other side of the core layer 110 may be connected to an inner via IV12.

The first antenna A1 may be formed on one surface of the laminate 100-1 to receive or transmit signals. The first antenna A1 may be formed on one surface of the outermost layer among the insulating layers 120-1. The first antenna A1 may include a patch antenna or may include a plurality of patch antennas to form an antenna array. The patch antenna may have a quadrangular shape, but the disclosure is not limited to this example. The first antenna A1 may include a dipole antenna, a monopole antenna, and the like as well as the patch antenna.

The PCB of FIG. 3 may further include the second antenna A2, the additional antenna A3, a flexible insulating layer 200, and the solder resist layer SR.

The second antenna A2 is formed in the laminate 100-1 to vertically correspond to the first antenna A1. That is, the first antenna A1 and the second antenna A2 may at least partially overlap each other in the vertical direction. The second antenna A2 and the first antenna A1 may be the same type of antenna. For example, the first antenna A1 and the second antenna A2 may both be patch antennas, and may form an antenna array. In this case, the entire antenna array of the first antenna A1 may vertically correspond to the entire antenna array of the second antenna A2.

The second antenna A2 may be formed on one surface of the core layer 110 (a surface facing the first antenna A1, i.e., an upper surface in FIG. 3). Also, the second antenna A2 may be electrically connected to the through-via TV passing through the core layer 110.

At least some of the insulating layers 120-1 may be disposed between the first antenna A1 and the second antenna A2. In FIG. 3, non-flexible layers 121 and flexible layers 122 are interposed between the first antenna A1 and the second antenna A2. For example, the insulating layers 120 are stacked on an upper side of the core layer 110, the first antenna A1 may be formed on one surface of the outermost layer among the non-flexible layers 121, and the second antenna A2 may be formed on one surface of the core layer 110. The first antenna A1 and the second antenna A2 may be directly connected through a via. However, even when the first antenna A1 and the second antenna A2 are not directly connected to each other, the insulating layer 120-1 between the first antenna A1 and the second antenna A2 is a dielectric and an electrical interaction may occur between the first antenna A1 and the second antenna A2.

Third to Nth antennas may be disposed between the first antenna A1 and the second antenna A2. For example, antennas (the third to Nth antennas) corresponding to the first antenna A1 and the second antenna A2 may be disposed on one surface of each of the insulating layers 120-1 disposed between the first antenna A1 and the second antenna A2. Also, the second to Nth antennas are removable, and the first antenna A1 may function alone.

The additional antenna A3 may be formed inside the laminate 100-1 to transmit or receive signals different from those of the first antenna A1. The additional antenna A3 may be located at the other side of the core layer 110 (a side not facing the first antenna A1, i.e., a lower side in FIG. 3). As a result, the first antenna A1 and the additional antenna A3 may be located at opposite sides with respect to the core layer 110.

The additional antenna A3 and the first antenna A1 may be different types of antennas. For example, the first antenna A1 may be a patch antenna, and the additional antenna A3 may be a monopole antenna or a dipole antenna. The additional antenna A3 may be used to process various signals in one PCB.

The additional antenna A3 may be electrically connected to the circuit C12 formed in the laminate 100-1 through the inner via IV12.

The flexible insulating layer 200 may be formed of a resin material that is bendable and flexible, and may include any one or any combination of any two or more of PI, an LCP, PTFE, Teflon, PFA, PPS, PPE, and PPO. The Df of the flexible insulating layer 200 may be less than or equal to 0.002.

The flexible insulating layer 200 may have a region in vertical contact with one of the insulating layers 120-1 and a remaining region located outside the laminate 100-1 in a lateral direction. Herein, the phrase "in vertical contact with" means that the referenced layers or structures are disposed to be stacked in a vertical direction such that the layers or structures overlap with respect to the vertical direction. The region of the flexible insulating layer 200 in vertical contact with the one of the insulating layers 120-1 may be located inside the laminate 100-1 and may be in vertical contact with two of the plurality of insulating layers 120-1. That is, the flexible insulating layer 200 may be interposed between the two insulating layers 120-1. The one of the insulating layers 120-1 in contact with the flexible insulating layer 200 may be the flexible layer 122 or the non-flexible layer 121. As shown in FIG. 3, when the flexible insulating layer 200 is formed close to the core layer 110, a thermosetting resin layer 122b' may be interposed between the core layer 110 and the flexible insulating layer 200.

The flexible insulating layer 200 may be composed of vertically stacked layers. Also, the flexible insulating layer 200 may include a thermosetting resin layer 210b and a thermoplastic resin layer 210a which are vertically stacked, and the thermosetting resin layer 210b may be an adhesive layer. The flexible insulating layer 200 may include a plurality of thermosetting resin layers 210b and a plurality of thermoplastic resin layers 210a, and thermosetting resin layers 210b and the thermoplastic resin layers 210a may be alternately stacked. In this example, the thermoplastic resin layer 210a may be located at the outermost layer of the flexible insulating layer 200. Also, when the flexible insulating layer 200 is formed close to the core layer 110, the thermosetting resin layer 122b' may be interposed between the core layer 110 and the thermoplastic resin layer 210a.

A connection terminal 220 may be formed at one end of the flexible insulating layer 200, for example, at one end of the flexible insulating layer 200 positioned outside the laminate 100-1. The connection terminal 220 may be connected to the external board B. For example, the connection terminal 220 may be connected to the terminal T of the external board B. The connection terminal 220 of the flexible insulating layer 200 and the terminal T of the external board B may be bonded to each other using the conductive member CM, such as solder. The connection terminal 220 may be buried in the flexible insulating layer 200 or may protrude from the flexible insulating layer 200.

The PCB of FIG. 3 includes a rigid portion R and a flexible portion F, and is a rigid flexible board in which the rigid portion R and the flexible portion F are integrally formed. This PCB is distinguished from a board with a rigid board and a flexible board separately manufactured and then combined with each other through soldering bonding or the like. In this embodiment, the rigid portion R includes the laminate 100-1 (the non-flexible layers 121 and the flexible layers 122) and the flexible insulating layer 200, and the flexible portion F includes the flexible insulating layer 200.

A circuit C2 may be formed in the flexible insulating layer 200. The circuit C2 may be electrically connected to the connection terminal 220. The connection terminal 220 may be a portion of the circuit C2. The circuit C2 may include straight circuit lines extending in a longitudinal direction of the flexible insulating layer 200.

When the flexible insulating layer 200 includes the thermosetting resin layer 210b and the thermoplastic resin layer 210a, the circuit C2 may protrude to the thermosetting resin layer 210b at an interface between the thermosetting resin layer 210b and the thermoplastic resin layer 210a. Said another way, a layer of the circuit C2 may be partially embedded in a respective thermosetting resin layer 210b. Accordingly, the thermosetting resin layer 210b may cover the circuit C2. The circuit C2 may have portions formed in different layers and electrically connected to one another through an inner via IV2. The inner via IV2 may pass through both the thermosetting resin layer 210b and the thermoplastic resin layer 210a.

The circuit C2 may be electrically connected to the portion of the circuit C0 formed on the other surface of the core layer 110 through an inner via IV13, and the inner via IV13 may pass through both of the thermosetting resin layer 122b' stacked on the other surface of the core layer 110 and the thermoplastic resin layer 210a located at the outermost layer of the flexible insulating layer 200.

Also, the additional antenna A3 may be electrically connected to the circuit C2 of the flexible insulating layer 200 through an inner via IV12'.

The solder resist layer SR may be stacked on both sides of the laminate 100. The solder resist layer SR may be stacked on one surface of the laminate 100-1 to expose the first antenna A1 and the portion of the circuit C11 used as the ground G and may be stacked on the other surface of the laminate 100 to expose the mounting pads P1 and P2.

Referring to FIG. 4, the package includes a PCB and an electronic element mounted on the PCB. In this example, the PCB is the same as the above-described PCB of FIG. 3, and thus redundant description thereof will be omitted.

The electronic element may process a signal received from the first antenna A1 or a signal to be transmitted to the first antenna A1, and may include various components such as an active element, a passive element, an IC, and the like. The electronic element may include various types of elements forming an electronic element module. For example, the electronic element may include the IC E1, such as an RFIC, and the passive element E2, such as a capacitor. A plurality of ICs E1 and a plurality of passive elements E2 may be included.

The electronic element may be mounted on the PCB using a conductive member CM, and the conductive member CM may be a solder member containing a low melting point metal, such as tin. For example, a pad is formed on the electronic element, and the mounting pads P1 and P2 are also formed on the PCB. Then, the pad of the electronic element and the mounting pads P1 and P2 of the PCB may be bonded to each other using the conductive member CM.

In the package of FIG. 4, the electronic element may be molded with a molding material M. The molding material may include a resin, and may be an EMC, for example.

Referring to FIG. 4, when the package is coupled to the external board B (e.g., a main board), the flexible insulating layer 200 may be extended and bent toward the external board B, and the connection terminal 220 is bonded to a terminal T of the external board B. Thus, the package may be electrically connected to the external board B.

When the first antenna A1 receives a signal, the received signal may be delivered to the electronic element via the circuits C0, C11, and C12 of the laminate 100-1, and the signal processed by the electronic element may be delivered to the external board B via the circuit C2 of the flexible insulating layer 200. On the contrary, when the first antenna A1 transmits a signal, the signal may be delivered from the external board B to the electronic element via the circuit C2 of the flexible insulating layer 200, and then the signal processed by the electronic element may be delivered to the first antenna A1 through the circuits C0, C11, and C12 of the laminate 100-1.

According to the example of FIG. 4, compared to a case in which a rigid board with an antenna formed thereon and a flexible board are separately produced and bonded to each other through soldering, a signal transmission path may be shortened, and the risk of signal loss occurring at soldering joints may be eliminated.

Figure 5:
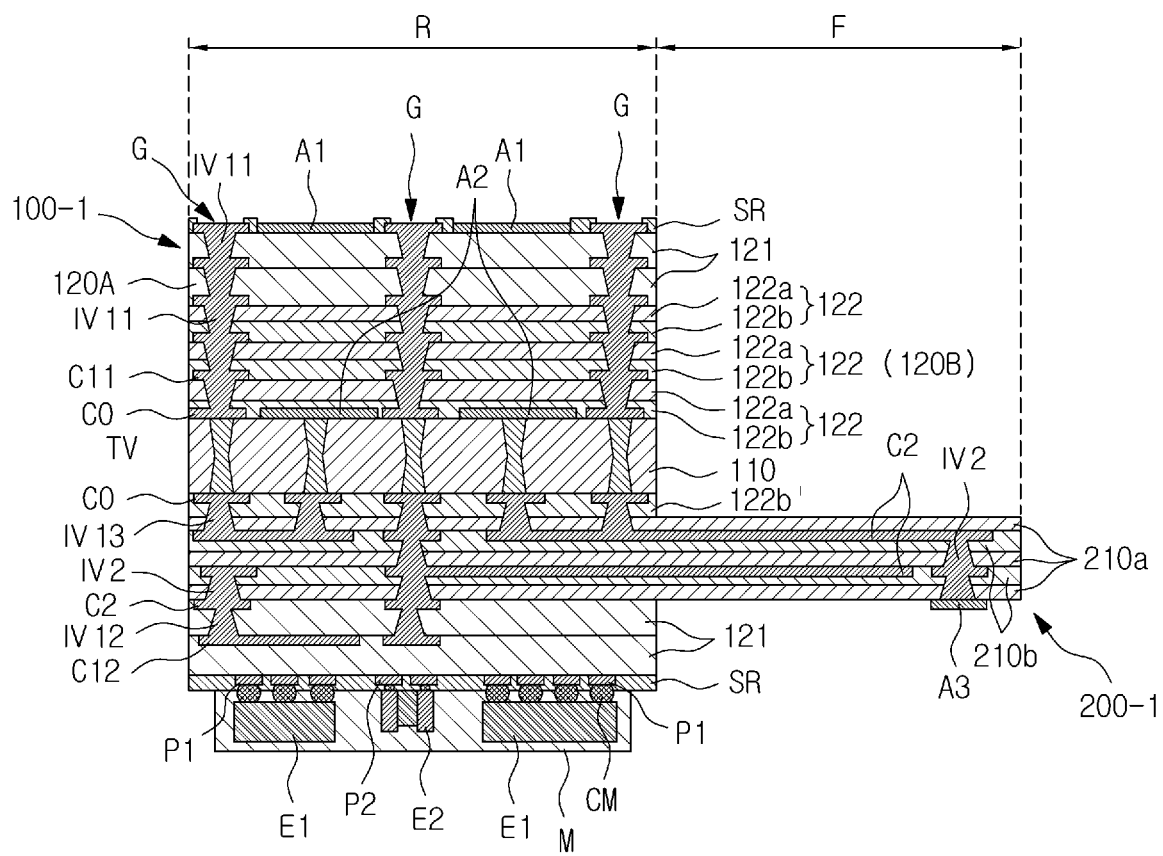
FIGS. 5 and 6 are diagrams showing a printed circuit board and a package including the printed circuit board, according to an embodiment.
Figure 6:
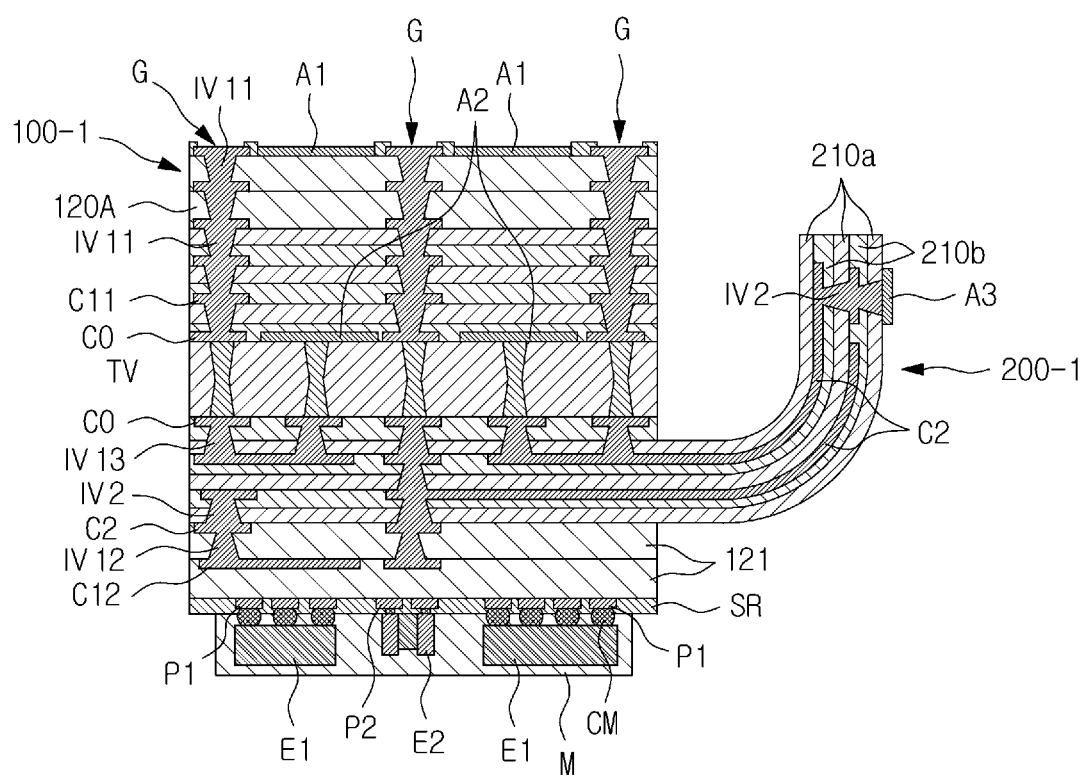

FIGS. 5 and 6 are diagrams showing a PCB and a package including the PCB, according an embodiment. In the embodiment of FIGS. 5 and 6, the elements that have been described in the embodiment of FIGS. 3 and 4 will not be described again. In the embodiment of FIGS. 5 and 6, an additional antenna A3, instead of the connection terminal 220 of FIGS. 3 and 4, is formed in a flexible insulating layer 200-1. The additional antenna A3 may be electrically connected to the circuit C2 of the flexible insulating layer 200-1 through the inner via IV2. Also, a portion of the circuit C2 of the flexible insulating layer 200-1 located inside the laminate 100-1 may be electrically connected to the circuit C12 inside the laminate 100-1 through the inner via IV12.

Referring to FIG. 6, the flexible insulating layer 200-1 may be bent, and thus the additional antenna A3 may be disposed to face the outside of the package. Similar to the embodiment of FIGS. 1 and 2, the package of FIGS. 5 and 6 may be bonded to a separate flexible board and thus electrically connected to the external board B.

Figure 7:
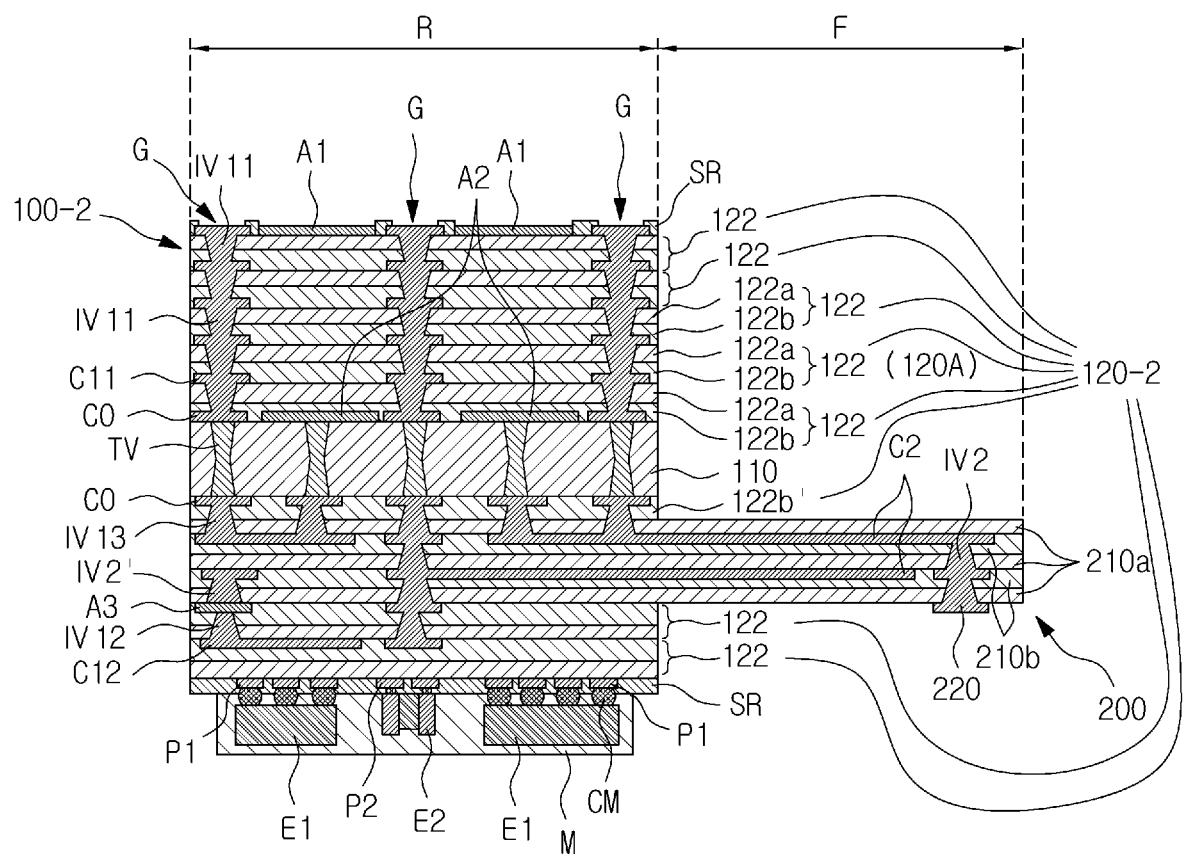
FIGS. 7 and 8 are diagrams showing a printed circuit board and a package including the printed circuit board, according to an embodiment.
Figure 8:
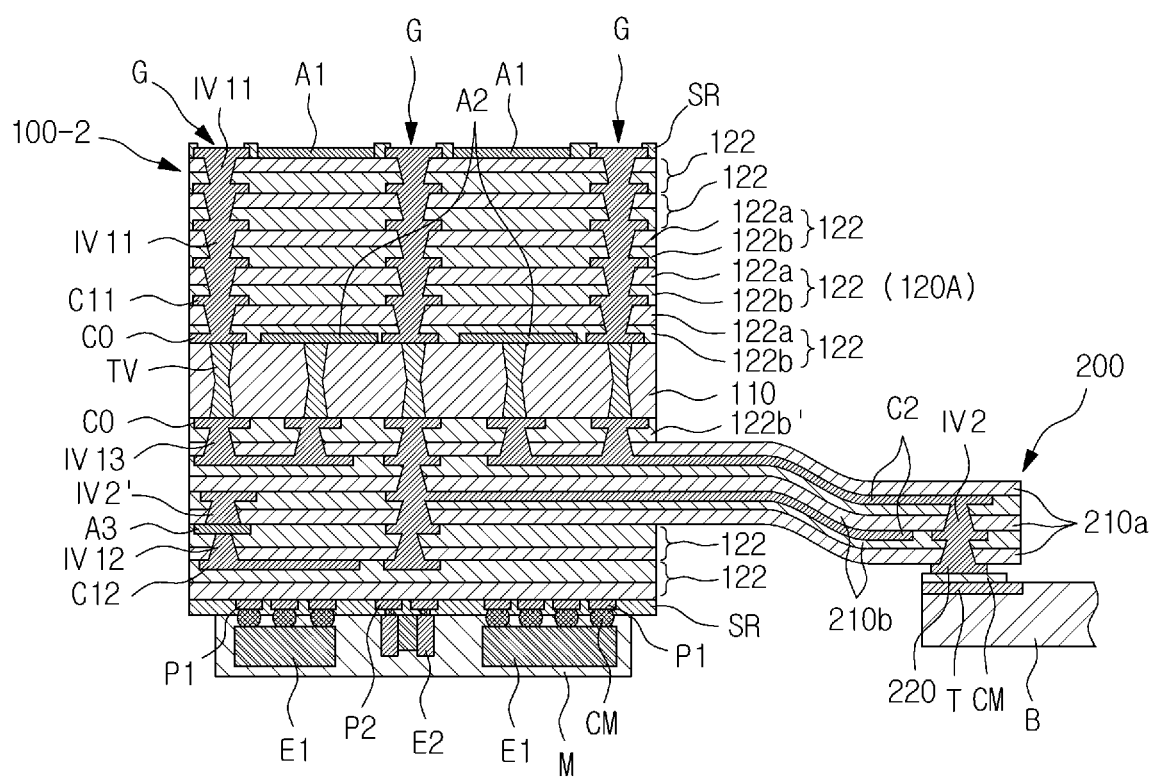

FIGS. 7 and 8 are diagrams showing a PCB and a package including the PCB, according to an embodiment. The embodiment of FIGS. 7 and 8 is similar to the embodiment of FIGS. 3 and 5, except that insulating layers 120-2 constituting a laminate 100-2 do not include a non-flexible layer and include only a flexible layer. The flexible layer may include a thermosetting resin layer 122b and a thermoplastic resin layer 122a. Thus, the laminate 100-2 may be formed by alternately stacking thermosetting resin layers 122b and thermoplastic resin layers 122a vertically with respect to the core layer 110. In this case, the core layer 110 may be in contact with the thermosetting resin layer 120b, and the thermoplastic resin layer 120a may be located at an outermost layer of the laminate 100.

Also, the flexible insulating layer 200 may include the thermosetting resin layer 210b and the thermoplastic resin layer 210a. In this case, throughout all the layers of the laminate 100-2, the thermosetting resin layers 122b and 210b and the thermoplastic resin layers 122a and 210a may be alternately and vertically stacked on the core layer 110.

One of the insulating layers (flexible layers) 120-2 may have a thickness that is less than a thickness of the core layer 110.

The core layer 110 may have a higher dielectric constant than a dielectric constant of the insulating layers (flexible layers) 120-2. That is, the core layer 110 may have a greater thickness and a higher dielectric constant than the flexible layer 120A. For example, the dielectric constant of the core layer 110 may be at least twice as high as that of the flexible layer 120A.

The core layer 110 may have a lower Df than one of the insulating layers (flexible layers) 120-2. The Df of the core layer 110 may be less than or equal to 0.003. The core layer 110 may have a greater thickness, a higher dielectric constant, and a lower Df than the one flexible layer 120A.

Also, the rigidity of the core layer 110 may be less than or equal to that of one of the insulating layers (flexible layers) 120-2. That is, the core layer 110 may have a greater thickness, a higher dielectric constant, and a lower Df than the flexible layer 120A, and a rigidity of the core layer 110 may be the same as or lower than that of the flexible layer 120A.

The solder resist layer SR may be stacked on both sides of the laminate 100-2, and the solder resist layer SR may be in contact with the thermoplastic resin layer 122a. The solder resist layer SR may be formed of a rigid material having a low bendability, and the rigid portion R of the PCB may include the solder resist layer SR.

Referring to FIG. 8, when the package is coupled to the external board B (e.g., a main board), the flexible insulating layer 200 may be extended and bent toward the external board B, and the connection terminal 220 of the flexible insulating layer 200 is bonded to the terminal T of the external board B. Thus, the package may be electrically connected to the external board B.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board, comprising:
   a laminate including a core layer and insulating layers vertically stacked on first and second sides of the core layer;
   a first antenna formed on a surface of the laminate; and
   a flexible insulating layer including a region in vertical contact with one of the insulating layers and vertically overlapping the core layer, and a remaining region disposed outside the laminate such that the remaining region does not vertically overlap the laminate,
   wherein a thickness of the core layer is greater than a thickness of the one of the insulating layers, and
   wherein a material of the core layer is different from a material of the one of the insulating layers.

2. The printed circuit board of claim 1, wherein a dielectric dissipation factor of the core layer is lower than a dielectric dissipation factor of the one of the insulating layers.

3. The printed circuit board of claim 1, wherein a rigidity of the core layer is less than or equal to a rigidity of the one of the insulating layers.

4. The printed circuit board of claim 1, further comprising a second antenna formed on a surface of the core layer.

5. The printed circuit board of claim 1, further comprising an additional antenna formed in the laminate such that the first antenna and the additional antenna are located on opposite sides with respect to the core layer.

6. The printed circuit board of claim 1, wherein a circuit pattern is disposed in or on the flexible insulating layer, in the remaining region.

7. The printed circuit board of claim 1, wherein an additional antenna is disposed at an end of the flexible insulating layer located outside the laminate.

8. The printed circuit board of claim 1, wherein the flexible insulating layer comprises a thermoplastic resin layer and a thermosetting resin layer that are vertically stacked.

9. The printed circuit board of claim 8, further comprising a circuit disposed on and protruding from the thermoplastic resin layer,
   wherein at least a portion of the circuit is embedded in the thermosetting resin layer.

10. The printed circuit board of claim 1, wherein the one of the insulating layers comprises a thermoplastic resin layer and a thermosetting resin layer that are vertically stacked.

11. The printed circuit board of claim 1, wherein another one of the insulating layers comprises a thermoplastic resin layer and a thermosetting resin layer that are vertically stacked.

12. The printed circuit board of claim 1, further comprising a solder resist layer stacked on either one or both of first and second sides of the laminate.

13. A module, comprising:
    a laminate including a core layer and insulating layers vertically stacked on first and second sides of the core layer;
    a first antenna formed on a surface of the laminate;
    an electronic element mounted on another surface of the laminate; and
    a flexible insulating layer including a region in vertical contact with one of the insulating layers and vertically overlapping the core layer, and a remaining region disposed outside the laminate such that the remaining region does not vertically overlap the laminate,
    wherein the electronic element comprises either one or both of an integrated circuit and a passive element, and
    wherein a thickness of the core layer is greater than a thickness of the one of the insulating layers, and
    wherein a material of the core layer is different from a material of the one of the insulating layers.

14. The module of claim 13, wherein a dielectric dissipation factor of the core layer is lower than a dielectric dissipation factor of the one of the insulating layers.

15. The module of claim 13, wherein a rigidity of the core layer is less than or equal to a rigidity of the one of the insulating layers.

16. The module of claim 13, further comprising a second antenna formed on a surface of the core layer.

17. The module of claim 13, further comprising an additional antenna formed in the laminate such that the first antenna and the additional antenna are disposed on opposite sides with respect to the core layer.

18. The module of claim 13, wherein a circuit pattern is formed in or on the flexible insulating layer, in the remaining region.

19. The module of claim 13, wherein an additional antenna is formed at an end of the flexible insulating layer located outside the laminate.

20. The module of claim 13, wherein the flexible insulating layer comprises a thermoplastic resin layer and a thermosetting resin layer that are vertically stacked.

21. The module of claim 20, further comprising a circuit disposed on and protruding from the thermoplastic resin layer,
    wherein at least a portion of the circuit is embedded in the thermosetting resin layer.

22. The module of claim 13, wherein the one of the insulating layers comprises a thermoplastic resin layer and a thermosetting resin layer that are vertically stacked.

23. The module of claim 13, wherein another one of the insulating layers comprises a thermoplastic resin layer and a thermosetting resin layer that are vertically stacked.

24. The module of claim 13, further comprising a solder resist layer stacked on either one or both of first and second sides of the laminate.

25. The printed circuit board of claim 8, wherein the thermoplastic resin layer comprises a liquid crystal polymer (LCP).

26. The printed circuit board of claim 8, wherein the thermosetting resin layer comprises a polyphenylene ether (PPE).

27. The printed circuit board of claim 10, wherein the thermoplastic resin layer comprises a liquid crystal polymer (LCP).

28. The printed circuit board of claim 10, wherein the thermosetting resin layer comprises a polyphenylene ether (PPE).

29. The printed circuit board of claim 11, wherein the thermoplastic resin layer comprises a liquid crystal polymer (LCP).

30. The printed circuit board of claim 11, wherein the thermosetting resin layer comprises a polyphenylene ether (PPE).

31. The module of claim 20, wherein the thermoplastic resin layer comprises a liquid crystal polymer (LCP).

32. The module of claim 20, wherein the thermosetting resin layer comprises a polyphenylene ether (PPE).

33. The module of claim 22, wherein the thermoplastic resin layer comprises a liquid crystal polymer (LCP).

34. The module of claim 22, wherein the thermoplastic resin layer comprises a polyphenylene ether (PPE).

35. The module of claim 23, wherein the thermoplastic resin layer comprises a liquid crystal polymer (LCP).

36. The module of claim 23, wherein the thermosetting resin layer comprises a polyphenylene ether (PPE).

37. The printed circuit board of claim 1, wherein a dielectric constant of the core layer is higher than a dielectric constant of the one of the insulating layers.

38. The module of claim 13, wherein a dielectric constant of the core layer is higher than a dielectric constant of the one of the insulating layers.

39. The printed circuit board of claim 1, wherein the first antenna comprises a pattern formed in or directly on another one of the insulating layers.

* * * * *